(12) United States Patent
Weidner

(10) Patent No.: US 8,846,456 B2
(45) Date of Patent: Sep. 30, 2014

(54) METHOD AND APPARATUS FOR MANUFACTURING AN ELECTRONIC MODULE, AND ELECTRONIC MODULE

(75) Inventor: Karl Weidner, München (DE)

(73) Assignee: Siemens Aktiengesellschaft, Munich (DE)

( * ) Notice: Subject to any disclaimer, the term of this patent is extended or adjusted under 35 U.S.C. 154(b) by 346 days.

(21) Appl. No.: 12/310,539

(22) PCT Filed: Aug. 29, 2007

(86) PCT No.: PCT/EP2007/059005
§ 371 (c)(1),
(2), (4) Date: Feb. 27, 2009

(87) PCT Pub. No.: WO2008/025805
PCT Pub. Date: Mar. 6, 2008

(65) Prior Publication Data
US 2010/0187700 A1 Jul. 29, 2010

(30) Foreign Application Priority Data

Aug. 31, 2006 (DE) .......................... 10 2006 040 724

(51) Int. Cl.
*H01L 21/00* (2006.01)
*H01L 23/31* (2006.01)
*H01L 23/00* (2006.01)
*H01L 21/56* (2006.01)
*H05K 3/28* (2006.01)

(52) U.S. Cl.
CPC .. *H01L 23/3121* (2013.01); *H05K 2201/10674* (2013.01); *H01L 2224/2402* (2013.01); *H01L 2224/24051* (2013.01); *H01L 2924/19041* (2013.01); *H01L 23/3164* (2013.01); *H01L 2924/01006* (2013.01); *H01L 2924/01082* (2013.01); *H01L 2224/82007* (2013.01); *H01L 2224/24998* (2013.01); *H01L 2924/01033* (2013.01); *H05K 2203/063* (2013.01); *H01L 24/76* (2013.01); *H01L 24/24* (2013.01); *H01L 2224/92244* (2013.01); *H01L 21/56* (2013.01); *H01L 2924/01023* (2013.01); *H01L 24/82* (2013.01); *H05K 2203/1311* (2013.01); *H05K 2203/0537* (2013.01); *H01L 2924/01079* (2013.01); *H05K 3/284* (2013.01); *H01L 2924/0102* (2013.01); *H05K 2203/074* (2013.01); *H01L 2924/014* (2013.01); *H01L 2924/01005* (2013.01); *H01L 2924/01029* (2013.01)

USPC ............. 438/127; 257/E21.24; 257/E23.116; 156/381; 156/382; 438/106

(58) Field of Classification Search
CPC ............ H01L 2224/81; H01L 2224/97; H01L 2924/00; H01L 21/56; H01L 24/24; H01L 24/27; H01L 24/79; H01L 24/82
USPC ......................... 438/106, 118, 124, 126, 127
See application file for complete search history.

(56) References Cited

U.S. PATENT DOCUMENTS 5,221,642 A * 6/1993 Burns ........................... 156/233
5,405,731 A 4/1995 Chandrasekaran et al.
(Continued)

FOREIGN PATENT DOCUMENTS

DE 40 18 177 A1 12/1991
DE 43 43 590 A1 7/1994
(Continued)

OTHER PUBLICATIONS

International Search Report for Application No. PCT/EP2007/059005; mailed Nov. 30, 2007.
German Office Action for Application No. 10 2006 040 724.5; dated Jun. 22, 2007.

*Primary Examiner* — Leonard Chang
(74) *Attorney, Agent, or Firm* — Staas & Halsey LLP

(57) ABSTRACT

A substrate which has at least one component, such as a semiconductor chip, arranged on it is manufactured from a film made of plastic material laminated onto a surface of the substrate and of the at least one component, where the surface has at least one contact area. First, the film to be laminated onto the surface of the substrate and the at least one component, or a film composite including the film, is arranged in a chamber such that the chamber is split by the film or film composite into a first chamber section and a second chamber section, which is isolated from the first chamber section so as to be gastight. A higher atmospheric pressure is provided or produced in the first chamber section than in the second chamber section; and contact is made between the surface of the substrate arranged in the second chamber section and the at least one component and the film or the film composite, which contact brings about the lamination of the film onto the surface.

21 Claims, 2 Drawing Sheets

(56) References Cited

U.S. PATENT DOCUMENTS

| | | |
|---|---|---|
| 6,453,963 B1 | 9/2002 | Furukawa et al. |
| 6,492,194 B1 | 12/2002 | Bureau et al. |
| 6,613,608 B1 * | 9/2003 | Yamaguchi et al. .......... 438/119 |
| 7,142,433 B2 | 11/2006 | Lechner |
| 7,528,077 B2 * | 5/2009 | Izuno et al. .................. 438/778 |
| 2002/0109264 A1 | 8/2002 | Lechner |

FOREIGN PATENT DOCUMENTS

| | | |
|---|---|---|
| DE | 101 07 399 A1 | 9/2002 |
| DE | 600 02 635 T2 | 2/2004 |
| EP | 1 093 159 A1 | 4/2001 |
| EP | 1 231 824 A2 | 8/2002 |
| JP | 64-87325 | 3/1989 |
| WO | 88/02551 | 4/1988 |

* cited by examiner

METHOD AND APPARATUS FOR MANUFACTURING AN ELECTRONIC MODULE, AND ELECTRONIC MODULE

CROSS REFERENCE TO RELATED APPLICATIONS

This application is based on and hereby claims priority to German Application No. 10 2006 040 724.5 filed on Aug. 31, 2006, the contents of which are hereby incorporated by reference.

BACKGROUND

Described below is a method and apparatus for manufacturing an electronic module which has a substrate on which at least one component, in particular a semiconductor chip, is arranged.

The starting point for manufacturing the electronic module is the semifinished electronic module shown schematically in cross-section in FIG. 1 and marked with the reference character 10. A structured metal layer 12 with metal or contact areas 13, 14, 15 is applied to a substrate 11. A component 16, 19, e.g. a semiconductor chip, is mounted on the contact areas 13, 14 respectively. The component 16 is connected to the contact area 13 by way of a connection 22, generally a solder. The component 19 is connected correspondingly to the contact area 14 by way of a connection 23. If the components have a backside contact, in other words a contact facing the substrate 11, the connection 22, 23 establishes both a mechanical and an electrical connection to the respective contact area 13 and/or 14. For electrical contacting purposes the components 16, 19 each have a number of contact areas on their top side facing away from the substrate 11. For example the components 16, 19 each include two contact areas 17, 18 or 20, 21. The electrical connection between the contact areas 17, 18 or 20, 21 and the (just by way of example) one contact area 15 is generally achieved using bonding wires (not shown).

Alternatively electrical connections can be established between the contact areas 17, 18 or 20, 21 of the components 16, 19 and the contact area 15 using what is termed planar interconnection technology, in which a surface 29 of the semifinished product is first covered with an insulating layer. Openings are made in the insulating film at the sites of the contact areas 15, 17, 18, 20, 21 to expose the contact areas. A sputter layer is then applied to the insulating film and its openings to provide full coverage. The sputter layer generally has an approximately 50 nm thick titanium layer and an approximately 1 μm thick copper layer. A further light-sensitive film (called photo-film), generally made of an insulating material, is applied to this sputter layer. The photo-film is generally between 100 and 200 μm thick and in a later step is exposed and developed according to the desired conducting structure.

Exposure generally takes place using a mask which is used to transfer the layout of the conducting structure onto the photo-film. The mask shades those sections of the photo-film that are to form the subsequent electrically conducting structure. The unexposed sections of the photo-film can be removed in a further operation to expose the underlying sputter layer, or more precisely the copper surface. Immersing the prepared semifinished product in an electrolyte bath, in particular a copper electrolyte bath, causes an approximately 100 to 200 μm thick copper layer to be grown due to galvanic reinforcement. In a subsequent step, referred to as stripping the photo-film, the photo-film still present on the surface in regions where no electrically conducting structure is to be formed is removed. The last step involves what is termed differential etching, in which the entire sputter layer of titanium and copper is removed so that only the desired conductive structure remains.

The application of the insulating film to the surface 29 of the semifinished product 10 is critically important for the reliability of an electronic module manufactured in this manner. The quality of adhesion and any air inclusions between the insulating film and the surface 29 can influence the electrical characteristics or even lead to the destruction of the electronic module during operation. This is so particularly when the components 16, 19 are power semiconductor components which are embodied to switch voltages in the range from 400 V to 10 kV. As well as influencing the insulation characteristics of the insulating film (generally in the range from 60 to 100 kV/mm for an insulating film with a thickness of 100 to 400 μm) the presence of any air inclusions in particular influences the electric field strength range and therefore the characteristics of the subsequent electronic module. Critical points here are in particular the upper lateral-edge shown with the reference character 24 in FIG. 1 and the lower lateral edge of the component 19 shown with the reference character 25. These problems affect all the corresponding lateral edges of this and other components, even though this is not shown specifically with reference characters in the figure.

SUMMARY

An aspect is a method for manufacturing an electronic module which avoids the problems described above and allows electronic modules having a high level of reliability to be manufactured. A further aspect is an apparatus for manufacturing such an electronic module.

As part of the method for manufacturing an electronic module which includes a substrate on which at least one component, in particular a semiconductor chip, is arranged, in at least one operation a film made of a plastic material is laminated onto a surface of the substrate which includes at least one contact area and of the at least one component. The film to be laminated onto the surface of the substrate and of the at least one component or a film composite including the film is arranged in a chamber such that the chamber is divided by the film or the film composite into a first chamber section and a second chamber section that is isolated from the first in a gastight manner; a higher atmospheric pressure is provided or produced in the first chamber section than in the second chamber section; contact is established between the surface of the substrate with the at least one component arranged in the second chamber section and the film or the film composite, causing the film to be laminated onto the surface.

The method allows the bubble-free application of the film to the surface of the semifinished product having a substrate and the at least one component to be ensured, thereby reducing the rejection rate for finished electronic modules. The method also has the advantage that the film can be applied very quickly, thereby shortening the production time for manufacturing the electronic module and resulting in lower manufacturing costs.

An apparatus for implementing the method can be embodied very simply in respect of structure.

An electronic module with a substrate on which at least one component, in particular a semiconductor chip, is arranged, with a film made of a plastic material being laminated onto a surface of the substrate and of the at least one component, is wherein the film has the same thickness at straight edges and at curves. This means that it is possible to determine the field strength characteristics in advance, in particular when using power semiconductor components, allowing the quality of such a module overall to be improved. In particular this reduces the risk of voltage flashovers between the electrically conducting structure embodied on the film and a contact area of the component. The risk of destruction due to overheating is also reduced.

According to a first variant the film is embodied to provide full coverage in order to be able to achieve gas-tight isolation of the chamber in the first and second chamber sections and to provide a pressure gradient. An opening is provided in the film in the region of the at least one contact area only after lamination, so that the application of an electrically conducting structure can then be undertaken.

In another embodiment, to form the film composite, the film is provided with at least one opening and applied to a full-coverage gas-tight plastic film serving as a forming film. The gas-tight isolation is therefore provided by the forming film, not by the film to be laminated on (insulating film). The material used for the forming film is a material that is "softer" than the film to be laminated during the lamination step. This ensures that no inclusions can result between the film and the component when the film is laminated onto the surface of the substrate with the at least one component. The forming film "flows round" the film from the side opposite the substrate and also exerts a pressure when the film is applied.

The film composite is arranged in the chamber such that the film to be laminated faces the second chamber section. The film composite is expediently arranged in the chamber such that the at least one opening in the film comes to be positioned in the region of a corresponding contact area during lamination. After the step of laminating the film onto the surface, the forming film is detached from the laminated film.

Using a film composite has the advantage that the usual step of making openings in the region of the at least one contact area can be omitted. Openings are generally made using lasers. However the use of such lasers is very cost-intensive because of the long time required for that. Using a film composite as part of the manufacturing method means that it is possible to dispense completely with the use of such laser apparatus, thereby enabling manufacturing costs and the time required to manufacture the electronic module to be reduced.

To apply the film or film composite to the surface of the semifinished product it is sufficient to produce a pressure difference between the first and second chamber sections. To avoid air inclusions between the film and the surface of the semifinished product however it is advantageous to evacuate the second chamber section in which the semifinished product is located. It is sufficient here if, according to a further embodiment, there is at least an isostatic pressure in the first chamber section.

To increase the pressure in the first chamber section, provision can optionally be made for a gas, in particular oxygen or nitrogen, or even a gel to be conveyed into the first chamber section. The pressure increase in the first chamber section ensures faster application of the film to the surface and also reduces the risk of air inclusions. The use of nitrogen is desirable to increase the pressure in the first chamber section, as nitrogen and the film to be laminated onto the surface do not show any reaction to one another. It is thus possible to avoid weakening the film during production.

A further improvement in connection quality results if the substrate with the at least one component is arranged on a heatable baseplate of the chamber, with both the substrate with the at least one component as well as the second chamber section being heated in a defined manner by the baseplate. Operating temperatures in the range from 150 to 200° C. have proven expedient for this, as in this temperature range the film and surface can be connected in a reliable manner and at the same time the components disposed on the substrate are only subjected to a low level of stress.

To establish the contact between the surface of the substrate with the at least one component arranged in the second chamber section and the film or film composite, a movement of the contact partners relative to each other is produced. It is irrelevant here whether the semifinished product or the film is moved. It is also possible for both the semifinished product and the film to be moved toward each other.

In a further expedient operation in the method, provision is made for slopes to be produced on sections of the at least one component that run essentially perpendicular to the substrate before the lamination step, the slopes connecting lateral edges of the component to the substrate in a continuous transition. Even though the method ensures a reliable adhesion of the film to perpendicular sections of the at least one component even without the provision of such slopes, the provision of such slopes can reduce or "neutralize" the angle assumed by the film. The advantage of providing such slopes is in particular that in a later step when a light-sensitive film is exposed to produce an electrically conducting structure, the photo-film is also reliably exposed in proximity to or on the perpendicular sections. In particular it allows the use of mask technology to expose the light-sensitive film.

To post-cure or harden the laminated film, the composite (film and substrate with the at least one component) can remain in the chamber for a predetermined time with a predefined temperature profile, in particular at a higher temperature than that of the lamination process. This has the advantage that no additional apparatus apart from the chamber has to be provided to harden the composite. The cost of providing the production equipment can be reduced as a result.

Alternatively provision can also be made for the semifinished product to remain in a curing oven at a predefined temperature for a predetermined time to post-cure or harden the laminated film.

The method can be used both to laminate the insulating film to be applied directly to the surface of the substrate and of the at least one component and also to laminate the light-sensitive film to be applied later. An insulating film or a light-sensitive film (photo-film), in particular made of an insulating material, is therefore selected as the film to be laminated onto the surface.

As has become clear from the description above, the method can be used particularly advantageously for surfaces with a three-dimensional structure in particular. Irrespective of this it is also possible to laminate a film onto a two-dimensional surface.

BRIEF DESCRIPTION OF THE DRAWINGS

These and other aspects and advantages will become more apparent and more readily appreciated from the following description of an exemplary embodiment, taken in conjunction with the accompanying drawings of which.

DETAILED DESCRIPTION OF THE PREFERRED EMBODIMENT

Figure 1:
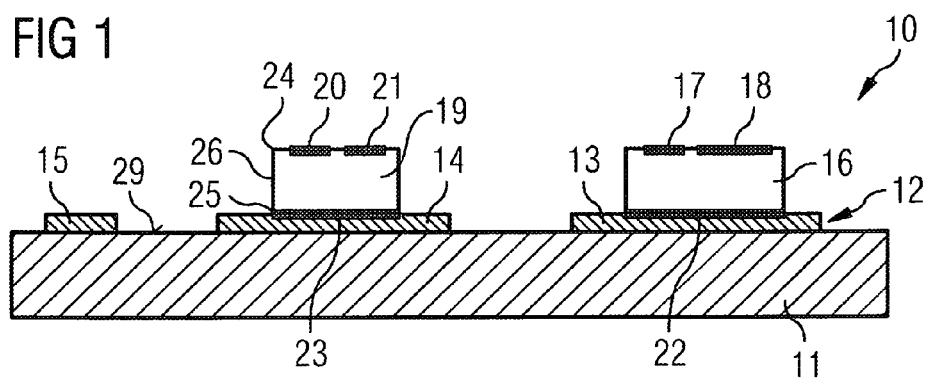
FIG. 1 is a schematic cross-sectional diagram of a semifinished electronic module.

Reference will now be made in detail to the preferred embodiments, examples of which are illustrated in the accompanying drawings, wherein like reference numerals refer to like elements throughout.

The basic structure of a semifinished electronic module 10 as depicted in FIG. 1 has already been described in the introductory part of the specification. The substrate can be a ceramic, a printed circuit board (PCB), a leadframe or a flextape for example. The components 16, 19 represent for example power semiconductor components which are embodied to switch high voltages in the range from 400 V to 10 kV. Power semiconductor components are generally provided with contact areas on their front and rear faces. Thus for example the contact area 20 of the component 19 represents a gate, the contact area 21 a source terminal, and a rear face contact (not shown) which is connected electrically to the contact area 14 represents a drain contact. The contact areas 17, 18 of the component 16 can be divided up correspondingly.

In contrast to the diagram, the heights of the components 16, 19 on the substrate do not have to be identical. With the present method it is even possible also to mount passive components, e.g. capacitors, on the surface 29, cover them with the insulating film and process them in the further operations.

The insulating film to be applied to the surface 29 has insulation characteristics that are matched to the components 16, 19, in the exemplary embodiment high insulation characteristics, being capable of absorbing 60 to 100 kV/mm. The thickness of the insulating film to be applied to the surface 29 can vary between 100 and 400 μm, depending on the application, as a function of the voltage to be insulated. The material characteristics of the insulating film are selected so that a continuous temperature load of 150 to 200° C. does not result in damage to the insulating film. In practice continuous temperature loads of 125° C. are currently sufficient.

Figure 2:
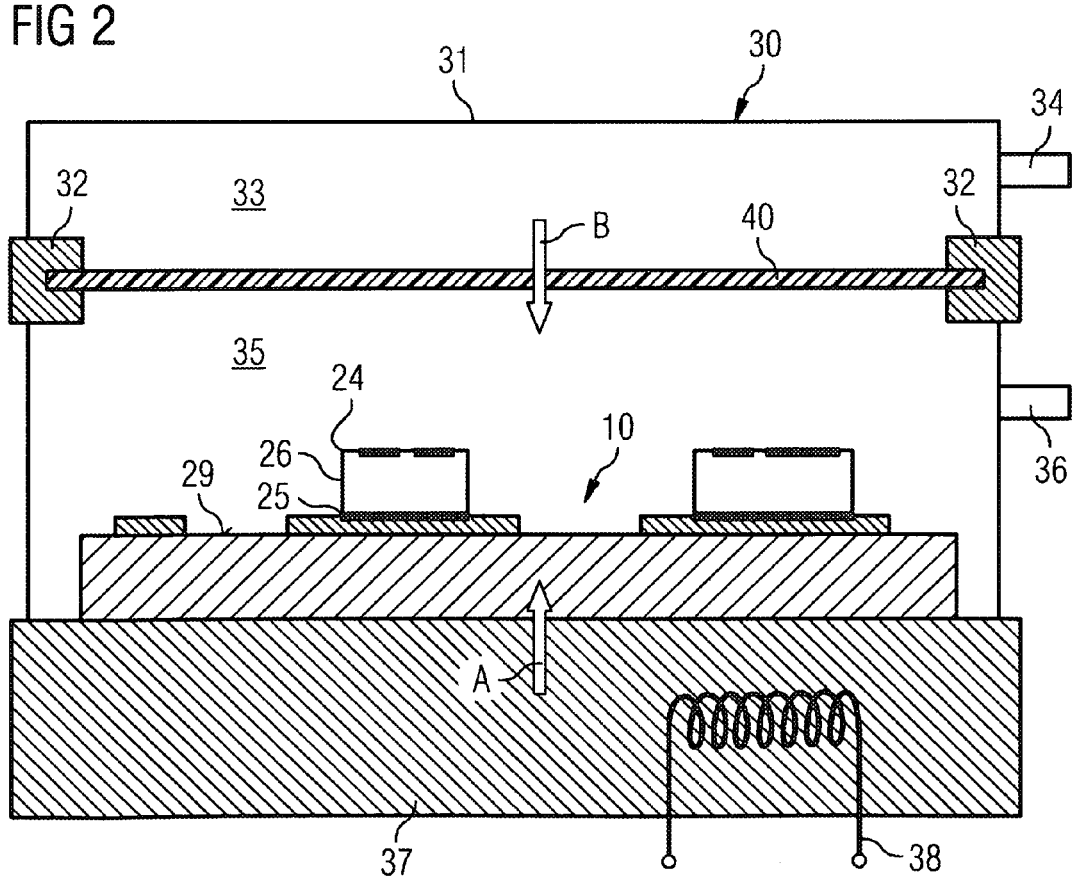
FIG. 2 is a schematic diagram of an apparatus for manufacturing an electronic module.

FIG. 2 shows a schematic diagram of an apparatus for laminating an insulating film onto the semifinished product 10 shown in FIG. 1. The apparatus 30 includes a chamber 31 with a baseplate 37, side walls and a roof. A heating unit 38 for heating the baseplate 37 and interior of the chamber 31 is arranged in the baseplate 37. The semifinished product 10 shown in FIG. 1 is arranged in the interior of the chamber 31 and on the baseplate 37. The insulating film 40, which is tensioned in a frame 32, divides the chamber 31 in a gas-tight manner into a first chamber section 33 and a second chamber section 35 in which the semifinished product 10 is arranged. Each of the chamber sections 33, 35 is provided with a tube connector 34 and 36 respectively, on a side wall for example. It is possible to evacuate the second chamber section 35 by way of the tube connector 36. A gas or gel for example can be introduced into the first chamber section 33 by way of the tube connector 34 to raise the pressure in the first chamber section 33 above isostatic pressure.

During the lamination process a pressure gradient is produced between the first and second chamber sections 33, 35. At the same time the heating unit 38 in the baseplate 37 is switched on to heat both the semifinished product 10 and the interior of the second chamber section 35. The temperatures thus achieved range between 50 and 200° C., with the components mounted on the substrate not experiencing any damage. A relative movement of the semifinished product 10 and the film 40 toward one another is then executed. The relative movement can result from movement of the baseplate 37 with the semifinished product 10 in the arrow direction marked A. Alternatively or additionally a movement of the frame 32 with the film 40 secured thereto can be effected in the direction of the surface 29 of the semifinished product 10. Heating by the heating unit 38 and the pressure difference cause the film 40, which is made of a soft material, to cling to the surface 29 of the semifinished product 10, thereby following the contour of the surface 29. The vacuum in the second chamber section prevents air inclusions between the film 40 with its full coverage and the surface 29 of the semifinished product 10.

By selecting the material of the film appropriately, setting the temperature in the chamber 31 appropriately and selecting the pressures in the first and second chamber sections 33, 35 correspondingly, it is possible to shape the film 40 to the surface 29 such that the film 40 experiences no variations in its thickness in the region of curves. This means that there are no changes in the cross-section of the insulating film at the lateral edges 24, 25 in particular. The method also ensures that the insulating film adheres to the perpendicular sections of the components 16, 19 (see reference character 26).

Figure 3:
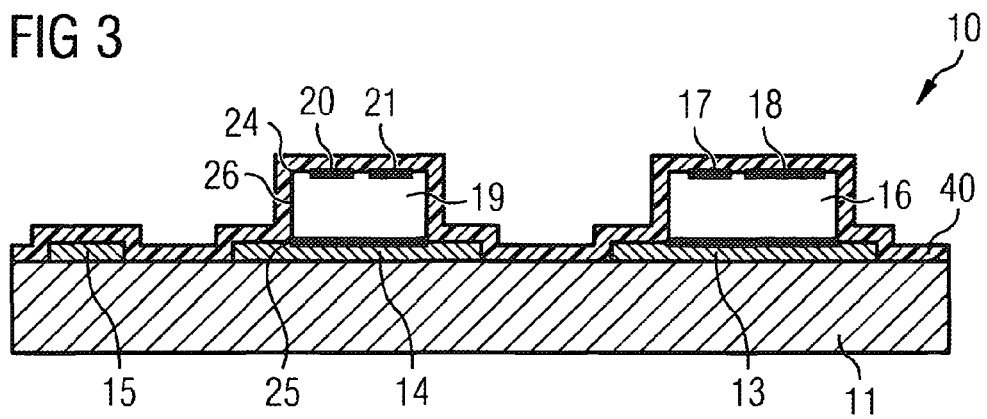
FIG. 3 is a schematic diagram of a semifinished electronic module onto which a film is laminated.

The film 40 is applied or laminated to the surface 29 of the semifinished product 10 using the soft, viscous characteristics of the film 40. The insulating film 40 has to be cured for further operation. For curing purposes the composite forming the semifinished product 10 and the film, as shown in FIG. 3, can remain in the apparatus 30 or be removed from the apparatus 30 and placed in a separate curing oven. It is expedient for curing purposes if temperatures that are higher than those of the lamination process act on the composite.

Once the film has been applied and cured the composite can be processed further by making openings in the insulating layer 40 in the region of the contact areas 15, 17, 18, 20, 21. The openings are generally made using a laser. This is followed by the application of a sputter layer, as described above, the application of a light-sensitive film made of an insulating material, the exposure, developing and galvanic deposition of an electrically conducting structure. The light-sensitive film (photo-film) can be applied using the described method in the apparatus shown in FIG. 2.

Figure 5:
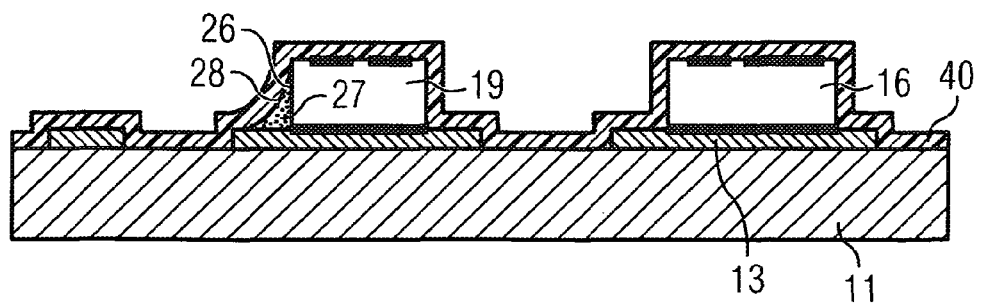
FIG. 5 is a second exemplary embodiment of a semifinished electronic module onto which a film is laminated.

FIG. 5 shows a modified schematic diagram of the composite forming the substrate and the at least one component 16, 19 and the applied film 40, likewise in cross-section. Before the film 40 was applied, a slope 28 was produced on the section 26, by applying, for example dispensing, an insulating material to the section 26. The insulating material, which was applied in liquid form for example, is sucked onto the side wall (section 26) of the component 19 by capillary forces, so that there are no gas inclusions. This produces the slope 28 with an edgeless profile shown in the figure. When the film 40 is applied in the apparatus described in FIG. 2, the film 40 complies to the profile of the slope 28.

In the exemplary embodiment in FIG. 5 a single slope 28 has been shown purely as an example, simply for the purposes of illustration. The provision of such slopes 28 has the advantage, during the further manufacture of the electronic module, that the subsequently applied light-sensitive photo-film also assumes the shape of the slope 28. When the photo-film is exposed it is then not necessary to take particular measures to expose the perpendicular sections of the photo-film as well. Provision of the slopes eliminates perpendicular sections firstly of the insulating film and then of the photo-film to the greatest possible extent, so that exposure can take place using conventional masks.

Figure 4:
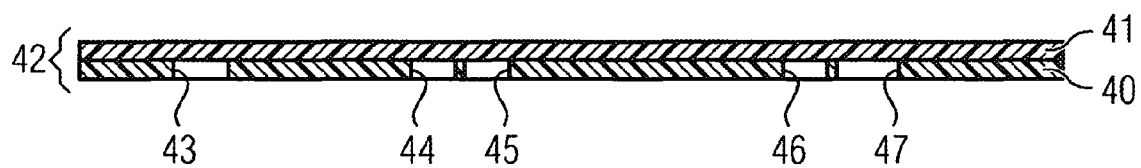
FIG. 4 is a schematic diagram of a film composite.

In one modification, a film composite 42 (see FIG. 4) is tensioned in the frame 32 of the apparatus 30 to apply the film 40. The film composite includes the film 40 in which openings 43, 44, 45, 46, 47 have already been made at the sites of the contact areas 15, 17, 18, 20, 21. In order to be able to provide a gas-tight seal between the first chamber section and the second chamber section 33, 35, the film composite also includes a full-coverage and gas-tight forming film 41 joined to the film 40. The forming film 41 may be made of a "softer" material than the film 40 in order to be able to help the film 40 cling to the three-dimensional structured surface 29 of the semifinished product 10 during the lamination process.

When the film composite 42 has been laminated onto the surface 29 of the semifinished product 10, curing takes place as described above. The forming film 41 is then detached from the film 40. When selecting the materials for the film 40 and the forming film 41 it must therefore be ensured that no cross-linking takes place between these two partners either during the lamination process or during post-curing in order to prevent the film 40 being detached, even only partially, from the surface 29 of the semifinished product 10 when the forming film 41 is detached. This can be ensured both by an appropriate material selection and by setting appropriate process parameters.

Since the composite made up of the substrate 11 with the at least one component 16, 19 and the film 40 already has the openings 43, 44, 45, 46, 47 in the region of the contact areas 15, 17, 18, 20, 21, there is no need to make the openings using a laser. This means that it is then possible to start applying a sputter layer immediately.

The system also includes permanent or removable storage, such as magnetic and optical discs, RAM, ROM, etc. on which the process and data structures of the present invention can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A method for manufacturing an electronic module having a substrate on which at least one semiconductor component is arranged by laminating, in at least one operation, a film made of a first plastic material onto a surface of the substrate and the at least one semiconductor component, the surface having at least one contact area, comprising:
    arranging one of the film to be laminated and a film composite including the film, prior to making contact with the surface of the substrate and the at least one semiconductor component, between side walls of a chamber so that the chamber is divided, by the one of the film and the film composite, into a first chamber section and a second chamber section that is isolated from the first chamber section in a gastight manner, the first and second chamber sections both defined by the side walls of the chamber;
    obtaining a higher atmospheric pressure in the first chamber section than in the second chamber section; and
    establishing contact between the surface of the substrate with the at least one semiconductor component arranged in the second chamber section and the one of the film and the film composite, thereby laminating the film onto the surface.

2. The method as claimed in claim 1,
    wherein said arranging results in the film providing full coverage, and
    further comprising, following the laminating, creating an opening in the film in a region of the at least one contact area.

3. The method as claimed in claim 1, further comprising forming the film composite by applying the film, with at least one opening, to a full-coverage and gas-tight forming film made of a second plastic material.

4. The method as claimed in claim 3, wherein the second plastic material is softer than the first plastic material.

5. The method as claimed in claim 4, wherein said arranging positions the film composite in the chamber with the film to be laminated facing the second chamber section.

6. The method as claimed in claim 5, wherein said arranging positions the film composite in the chamber so that the at least one opening in the film is positioned in a region of a corresponding contact area during lamination.

7. The method as claimed in claim 6, further comprising, after the laminating of the film onto the surface, detaching the forming film.

8. The method as claimed in claim 7, wherein said obtaining includes evacuating the second chamber section.

9. The method as claimed in claim 8, wherein there is at least an isostatic pressure in the first chamber section.

10. The method as claimed in claim 9, further comprising increasing pressure in the first chamber section by conveying at least one of a gel and a gas, including at least one of oxygen and nitrogen, into the first chamber section.

11. The method as claimed in claim 10, further comprising:
    arranging the substrate with the at least one semiconductor component on a heatable baseplate of the chamber; and
    heating both the substrate with the at least one semiconductor component as well as the second chamber section in a defined manner by the baseplate.

12. The method as claimed in claim 11, wherein said establishing is by relative movement between the one of the film and the film composite including the film, and the substrate with the at least one semiconductor component arranged in the second chamber section.

13. The method as claimed in claim 12, wherein the laminating produces slopes on sections of the at least one semiconductor component that run essentially perpendicular to the substrate before the laminating, the slopes connecting lateral edges of the semiconductor component to the substrate in a continuous transition.

14. The method as claimed in claim 12, further comprising, after the laminating, heating the chamber to post-cure or harden the film in the chamber for a predetermined time with a predefined temperature profile at a higher temperature than that of the laminating.

15. The method as claimed in claim 12,
    wherein the laminating produces a semifinished product, and
    further comprising keeping the semifinished product in a hardening oven at a predefined temperature for a predetermined time to post-cure or harden the film.

16. The method as claimed in claim 12, wherein the film to be laminated onto the surface is an insulating film.

17. The method as claimed in claim 16, wherein the insulating film is a light-sensitive film made of an insulating material.

18. The method as claimed in claim 16, wherein the surface onto which the film is laminated has a three-dimensional structure.

19. The method as claimed in claim 1, wherein said arranging does not use the substrate to divide the chamber.

20. The method as claimed in claim 1, wherein the chamber has a roof and a baseplate with the side walls extending therebetween.

21. The method as claimed in claim 20, wherein the first chamber section is bounded by the roof, side walls and the one of the film and the film composite and the second chamber section is bounded by the base plate, side walls and the one of the film and the film composite.

\* \* \* \* \*